United States Patent
Baehr-Jones et al.

(10) Patent No.: US 10,529,878 B1
(45) Date of Patent: *Jan. 7, 2020

(54) METAL-CONTACT-FREE PHOTODETECTOR

(71) Applicant: Elenion Technologies, LLC, New York, NY (US)

(72) Inventors: Thomas Wetteland Baehr-Jones, Arcadia, CA (US); Yi Zhang, Jersey City, NJ (US); Michael J. Hochberg, New York, NY (US); Ari Novack, New York, NY (US)

(73) Assignee: Elenion Technologies, LLC, New York, NY (US)

( * ) Notice: Subject to any disclaimer, the term of this patent is extended or adjusted under 35 U.S.C. 154(b) by 51 days.

This patent is subject to a terminal disclaimer.

(21) Appl. No.: 16/205,580

(22) Filed: Nov. 30, 2018

Related U.S. Application Data

(63) Continuation of application No. 16/030,134, filed on Jul. 9, 2018, now Pat. No. 10,217,881, which is a continuation of application No. 15/724,458, filed on Oct. 4, 2017, now Pat. No. 10,043,927, which is a continuation of application No. 15/377,294, filed on Dec. 13, 2016, now Pat. No. 9,812,598, which is a continuation of application No. 15/231,822, filed on Aug. 9, 2016, now Pat. No. 9,553,222, which is a continuation of application No. 14/644,122, filed on Mar. 10, 2015, now Pat. No. 9,437,759.

(60) Provisional application No. 61/950,816, filed on Mar. 10, 2014.

(51) Int. Cl.
*H01L 31/0352* (2006.01)
*H01L 31/18* (2006.01)

(52) U.S. Cl.
CPC ...... *H01L 31/0352* (2013.01); *H01L 31/1808* (2013.01)

(58) Field of Classification Search
CPC . H01L 31/107; H01L 31/0352; H01L 31/028; H01L 31/1808; H01L 31/0256; H01L 27/14698; H01L 27/14685; H01L 27/14638; H01L 31/105; H01L 27/14649; Y02E 10/547
USPC ...................................... 250/338.4
See application file for complete search history.

(56) References Cited

U.S. PATENT DOCUMENTS 7,397,101 B1 * 7/2008 Masini .................. H01L 31/028
257/184
10,043,927 B2 * 8/2018 Baehr-Jones ....... H01L 31/1808

* cited by examiner

*Primary Examiner* — David P Porta
*Assistant Examiner* — Meenakshi S Sahu
(74) *Attorney, Agent, or Firm* — Stratford Managers Corporation

(57) ABSTRACT

A Ge-on-Si photodetector constructed without doping or contacting Germanium by metal is described. Despite the simplified fabrication process, the device has responsivity of 1.24 A/W, corresponding to 99.2% quantum efficiency. Dark current is 40 nA at −4 V reverse bias. 3-dB bandwidth is 30 GHz.

20 Claims, 9 Drawing Sheets

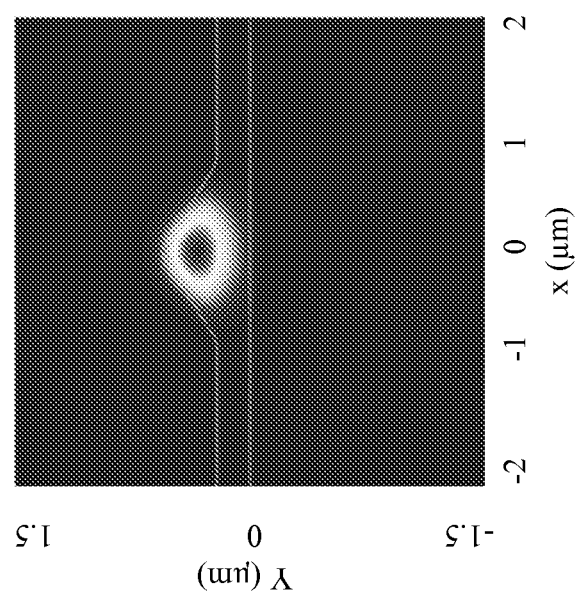
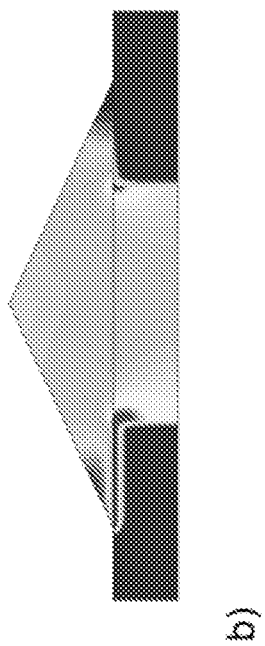
FIG. 3A
FIG. 3B

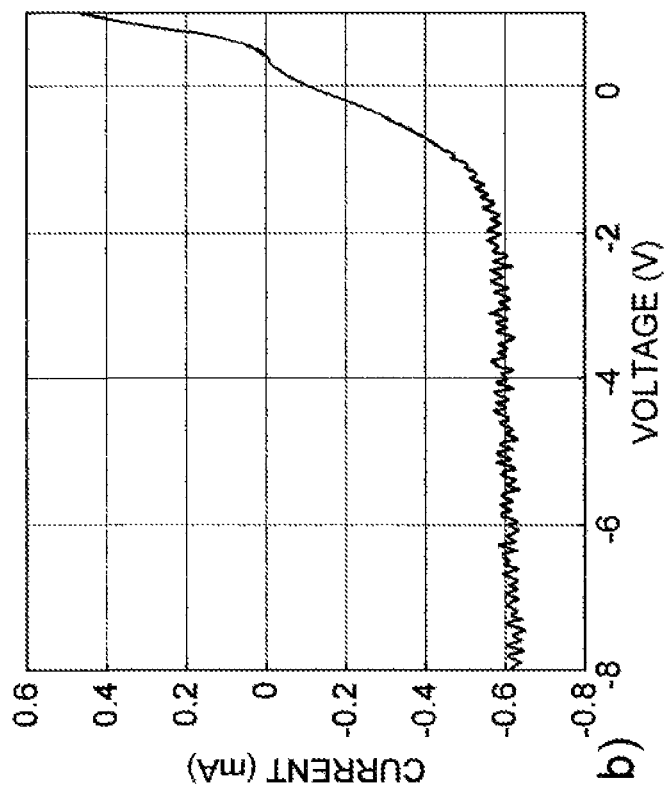
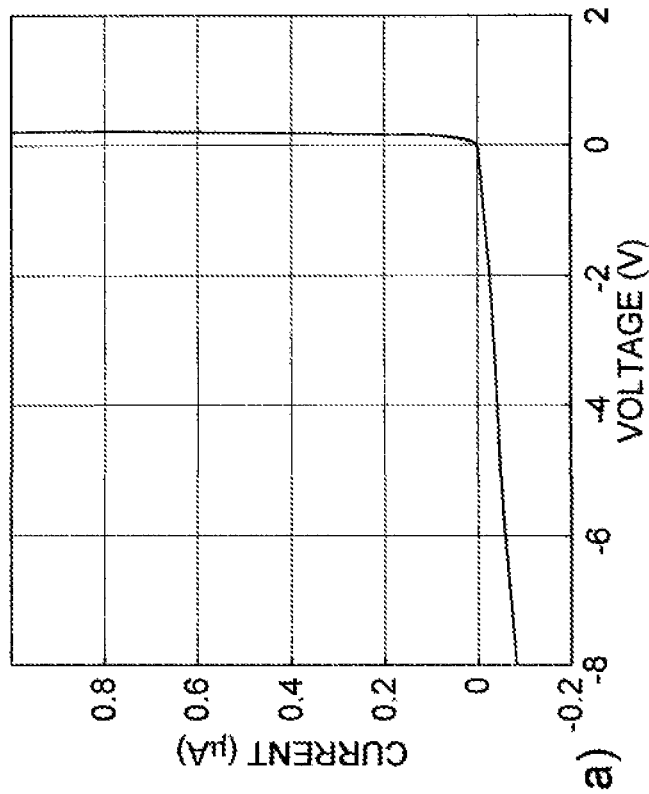
FIG. 5A
FIG. 5B

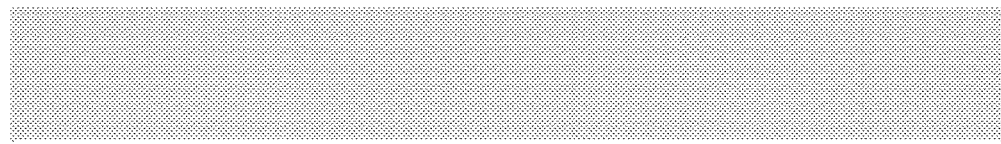
FIG. 7A
FIG. 7B
FIG. 7C
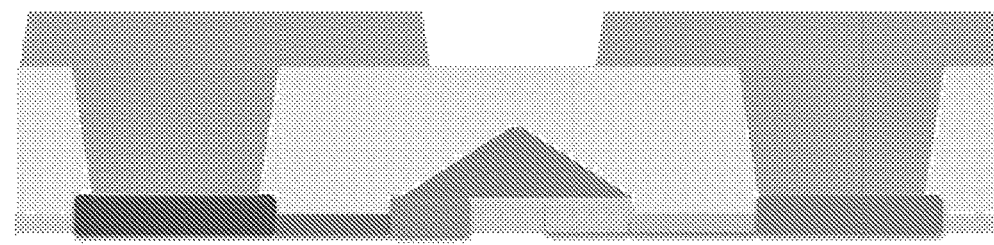
FIG. 7D
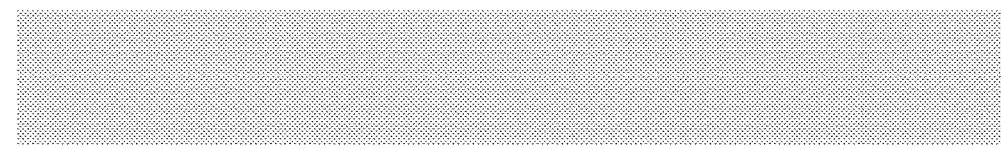

METAL-CONTACT-FREE PHOTODETECTOR

CROSS-REFERENCE TO RELATED APPLICATIONS

This application is a continuation of and claims priority to U.S. patent application Ser. No. 16/030,134, filed Jul. 9, 2018, now allowed, which is a continuation of U.S. patent application Ser. No. 15/724,458, filed Oct. 4, 2017, now U.S. Pat. No. 10,043,927, which is a continuation of U.S. patent application Ser. No. 15/377,294 filed Dec. 13, 2016, now U.S. Pat. No. 9,812,598, which is a continuation of U.S. patent application Ser. No. 15/231,822, filed Aug. 9, 2016, now U.S. Pat. No. 9,553,222, which is a continuation of U.S. patent application Ser. No. 14/644,122, filed Mar. 10, 2015, now U.S. Pat. No. 9,437,759, which claims priority to U.S. Provisional Application No. 61/950,816, filed Mar. 10, 2014, each of which is hereby incorporated by reference herein in its entirety.

FIELD OF THE INVENTION

The invention relates to photodetectors in general and particularly to germanium photodetectors.

BACKGROUND OF THE INVENTION

Traffic on the Internet keeps growing, due in large part to the increasing demand from mobile devices, streaming media services, cloud computing, and big data analysis. Silicon photonics is promising for providing high-speed, low energy consumption and low cost next generation data communication systems. The last decade has witnessed dramatic improvement and maturity of silicon photonics devices. High quality hybrid integrated lasers with sub-MHz linewidth, modulators and photodetectors supporting 40 Gb/s or higher data rates have all been demonstrated. See T. Creazzo, E. Marchena, S. B. Krasulick, P. K.-L. Yu, D. Van Orden, J. Y. Spann, C. C. Blivin, L. He, H. Cai, J. M. Dallesasse, R. J. Stone, and A. Mizrahi, "Integrated tunable CMOS laser," Opt. Express 21(23), 28048-28053 (2013); S. Yang, Y. Zhang, D. W. Grund, G. A. Ejzak, Y. Liu, A. Novack, D. Prather, A. E.-J. Lim, G.-Q. Lo, T. Baehr-Jones, and M. Hochberg, "A single adiabatic microring-based laser in 220 nm silicon-on-insulator," Opt. Express 22(1), 1172-1180 (2014); D. J. Thomson, F. Y. Gardes, J.-M. Fedeli, S. Zlatanovic, Y. Hu, B. P.-P. Kuo, E. Myslivets, N. Alic, S. Radic, G. Z. Mashanovich, and G. T. Reed, "50-Gb/s silicon optical modulator," IEEE Photon. Technol. Lett. 24(4), 234-236 (2012); T. Baba, S. Akiyama, M. Imai, N. Hirayama, H. Takahashi, Y. Noguchi, T. Horikawa, and T. Usuki, "50-Gb/s ring-resonator-based silicon modulator," Opt. Express 21(10), 11869-11876 (2013); C. T. DeRose, D. C. Trotter, W. A. Zortman, A. L. Starbuck, M. Fisher, M. R. Watts, and P. S. Davids, "Ultra compact 45 GHz CMOS compatible Germanium waveguide photodiode with low dark current," Opt. Express 19(25), 24897-24904 (2011); and L. Vivien, A. Polzer, D. Marris-Morini, J. Osmond, J. M. Hartmann, P. Crozat, E. Cassan, C. Kopp, H. Zimmermann, and J. M. Fédéli, "Zero-bias 40 Gbit/s germanium waveguide photodetector on silicon," Opt. Express 20(2), 1096-1101 (2012).

Transceivers and switch fabrics monolithically integrated with electronics have been reported. See B. Analui, D. Guckenberger, D. Kucharski, and A. Narasimha, "A fully integrated 20-Gb/s optoelectronic transceiver implemented in a standard 0.13-μm CMOS SOI technology," IEEE J. Solid-State Circuits 41(12), 2945-2955 (2006); J. F. Buckwalter, X. Zheng, G. Li, K. Raj, and A. V. Krishnamoorthy, "A monolithic 25-Gb/s transceiver with photonic ring modulators and Ge detectors in a 130-nm CMOS SOI process," IEEE J. Solid-State Circuits 47(6), 1309-1322 (2012); and B. G. Lee, A. V. Rylyakov, W. M. J. Green, S. Assefa, C. W. Baks, R. Rimolo-Donadio, D. M. Kuchta, M. H. Khater, T. Barwicz, C. Reinholm, E. Kiewra, S. M. Shank, C. L. Schow, and Y. A. Vlasov, "Monolithic silicon integration of scaled photonic switch fabrics, CMOS logic, and device driver circuits," J. Lightw. Technol. 32(4), 743-751 (2014). Coherent long-haul communication at 112 Gb/s was also demonstrated. See P. Dong, X. Liu, S. Chandrasekhar, L. L. Buhl, R. Aroca, Y. Baeyens, and Y.-K. Chen, "Monolithic silicon photonic integrated circuits for compact 100+Gb/s coherent optical receivers and transmitters," IEEE J. Sel. Topics Quantum Electron. 20(4), 6100108 (2014). Foundry services open access of advanced fabrication nodes to academic labs and startups, which would further speed up research and development of photonic integration on silicon. Se for example M. Hochberg and T. Baehr-Jones, "Towards fabless silicon photonics," Nat. Photonics 4, 492-494 (2010); and A. E.-J. Lim, J. Song, Q. Fang, C. Li, X. Tu, N. Duan, K. K. Chen, R. P.-C. Tern, and T.-Y. Liow, "Review of silicon photonics foundry efforts," IEEE J. Sel. Topics Quantum Electron. 20(4), 8300112 (2011).

One bottleneck that emerges during the design of silicon photonics based data links is the constraint on link power budget. A typical link power budget is around 9 dB. For example the IEEE 802.3 40GBASE-LR4 protocol has 6.7 dB allocated for channel insertion loss and 2.3 dB for penalties. Due to the large mode mismatch of glass fibers and submicron silicon waveguides, on-and-off chip coupling loss is usually quite high. The losses can exceed 1 dB in a mature commercial process. See A. Mekis, S. Gloeckner, G. Masini, A. Narasimha, T. Pinguet, S. Sahni, and P. De Dobbelaere, "A grating-coupler-enabled CMOS photonics platform," IEEE J. Sel. Topics Quantum Electron. 17(3), 597-608 (2011). On-chip devices tend to be lossy as well. For example, insertion losses of state of the art silicon modulators are more than 5 dB. In some cases, device insertion loss could be significantly reduced by design optimization, such as the y-junction, the waveguide crossing and by grating couplers. See Y. Zhang, S. Yang, A. E.-J. Lim, G.-Q. Lo, C. Galland, T. Baehr-Jones, and M. Hochberg, "A compact and low loss Y-junction for submicron silicon waveguide," Opt. Express 21(1), 1310-1316 (2013); Y. Ma, Y. Zhang, S. Yang, A. Novack, R. Ding, A. E.-J. Lim, G.-Q. Lo, T. Baehr-Jones, and M. Hochberg, "Ultralow loss single layer submicron silicon waveguide crossing for SOI optical interconnect," Opt. Express 21(24), 29374-29382 (2013); and W. S. Zaoui, A. Kunze, W. Vogel, M. Berroth, J. Butschke, F. Letzkus, and J. Burghartz, "Bridging the gap between optical fibers and silicon photonic integrated circuits," Opt. Express 22(2), 1277-1286 (2014). However, in other cases, insertion loss and device efficiency are orthogonal, for example, higher doping results in higher modulation efficiency, but leads to high insertion loss at the same time.

A photodetector with high responsivity will compensate the channel insertion loss, and help fulfill the required link power budget. Germanium can be epitaxially grown on silicon and is the preferred absorber material for its CMOS compatibility. Although metal-semiconductor-metal (MSM) and avalanche photodetector (APD) could provide high responsivity by photoconductive gain and avalanche multiplication, the benefit comes at the price of high dark current and (or) high bias voltage. Waveguide coupled p-i-n detectors attract extensive attention due to their high bandwidth, good responsivity and low dark current. Ge-on-Si detectors with lateral and vertical p-i-n junction configuration are illustrated in FIG. 1A and FIG. 1B. Attractive Ge-on-Si detector performances have been reported, with responsivity typically about 0.8 A/W and bandwidth high enough for 40 Gb/s operation. See for example T. Yin, R. Cohen, M. M. Morse, G. Sarid, Y. Chetrit, D. Rubin, and M. J. Paniccia, "31 GHz Ge n-i-p waveguide photodetectors on silicon-on-insulator substrate," Opt. Express 15(21), 13965-13971 (2007); and A. Novack, M. Gould, Y. Yang, Z. Xuan, M. Streshinsky, Y. Liu, G. Capellini, A. E.-J. Lim, G.-Q. Lo, T. Baehr-Jones, and M. Hochberg, "Germanium photodetector with 60 GHz bandwidth using inductive gain peaking," Opt. Express 21(23), 28387-28393 (2013) as well as some of the previously mentioned articles.

As shown in FIG. 1A and FIG. 1B, both types of device require heavily doped germanium to form the junction and direct contact of germanium to metal via plugs. Although the first transistor was demonstrated using germanium, silicon quickly took over and became the overwhelmingly dominating substrate material. Germanium processing has recently attracted attention because of interest in germanium and silicon-germanium transistors. See S. Brotzmann, and H. Bracht, "Intrinsic and extrinsic diffusion of phosphorus, arsenic, and antimony in germanium," J. Appl. Phys. 103, 033508 (2008), A. Claverie, S. Koffel, N. Cherkashin, G. Benassayag, and P. Scheiblin, "Amorphization, recrystallization and end of range defects in germanium," Thin Solid Films 518(9), 2307-2313 (2010); and H. Bracht, S. Schneider, and R. Kube, "Diffusion and doping issues in germanium," Microelectron. Eng. 88(4), 452-457 (2011). Germanium is much less well understood and characterized as compared to silicon. While silicon modulators have been optimized for efficiency (see Y. Liu, S. Dunham, T. Baehr-Jones, A. E.-J. Lim, G.-Q. Lo, and M. Hochberg, "Ultraresponsive phase shifters for depletion mode silicon modulators," J. Lightwave Technol. 31(23), 3787-3793 (2013)), similar TCAD models are still not seen for germanium detectors. Poly silicon was sometimes deposited on top of germanium to reduce contact resistivity and leakage current. See for example, C.-K. Tseng, W.-T. Chen, K.-H. Chen, H.-D. Liu, Y. Kang, N. Na, and M.-C. M. Lee, "A self-assembled microbonded germanium/silicon heterojunction photodiode for 25 Gb/s high-speed optical interconnects," Sci. Rep. 3, 3225 (2013); and K. Takeda, T. Hiraki, T. Tsuchizawa, H. Nishi, R. Kou, H. Fukuda, T. Yamamoto, Y. Ishikawa, K. Wada, and K. Yamada, "Contributions of Franz-Keldysh and avalanche effects to responsivity of a germanium waveguide photodiode in the L-band," IEEE J. Sel. Topics Quantum Electron. 20(4), 3800507 (2014).

There is a need for improved designs and structures for photodetectors made using germanium.

SUMMARY OF THE INVENTION

According to one aspect, the invention features a germanium p-i-n photodetector having a floating germanium body. The detector is also referred to as a metal-contact-free photodetector.

Accordingly, another aspect relates to a photodetector, comprising: a substrate; a device layer, including a waveguide, on a surface of the substrate; a first doped semiconductor contact in the device layer; and; a second doped semiconductor contact in the device layer; a semiconductor body, in electrical contact with the first doped semiconductor contact and the second doped semiconductor contact, the semiconductor body capable of generating electrical signals by absorbing electromagnetic radiation; a first metal terminal, in electrical communication with said first doped semiconductor contact; and a second metal terminal, in electrical communication with said second doped semiconductor contact; wherein the first and second metal terminals are configured to provide the electrical signals to external circuitry; wherein the first doped semiconductor contact comprising a first portion underneath the semiconductor body, a second portion underneath the first metal terminal, and a connecting slab extending in the device layer between the first and second portions; and wherein the second doped semiconductor contact comprising a first portion underneath the semiconductor body, a second portion underneath the second metal terminal, and a connecting slab extending in the device layer between the first and second portions.

In one embodiment, at least one of the first doped semiconductor contact and the second doped semiconductor contact is a doped silicon contact.

In one embodiment, at least one of the first doped semiconductor contact and the second doped semiconductor contact is doped with a p-type dopant.

In one embodiment, at least one of the first doped semiconductor contact and the second doped semiconductor contact is doped with an n-type dopant.

In one embodiment, the germanium photodetector further comprises a third doped semiconductor contact.

In one embodiment, wherein the intrinsic germanium body has a triangular cross section.

In one embodiment, the intrinsic germanium body is terminated in a (111) crystallographic face.

In still another embodiment, the intrinsic germanium body is planaraized.

In another embodiment, a crystallographic facet is oriented at an angle between substantially 15 degrees and 75 degrees to the surface of the silicon wafer.

In another embodiment, a measured quantum efficiency is greater than substantially 65%.

In yet another embodiment, a measured quantum efficiency is greater than substantially 75%.

In still another embodiment, a measured quantum efficiency is greater than substantially 85%.

In a further embodiment, a measured quantum efficiency is greater than substantially 95%.

In yet another embodiment, the electromagnetic radiation is in the wavelength range of substantially 1280-1600 nm in free space.

In another embodiment, the photodetector includes a p-i-n junction.

According to another aspect, the invention relates to a method of detecting electromagnetic radiation with a germanium photodetector. The method comprises providing a germanium photodetector, comprising: a first doped semiconductor contact; a second doped semiconductor contact; and an intrinsic germanium body in electrical contact with the first doped semiconductor contact and in electrical contact with the second doped semiconductor contact, the first doped semiconductor contact and the second doped semiconductor contact disposed on a same side of the intrinsic germanium body, the intrinsic germanium body lacking direct mechanical contact with a metal contact; the first doped semiconductor contact and the second doped semiconductor contact in electrical communication with respective metal terminals configured to provide electrical signals generated in the germanium photodetector by absorption of electromagnetic radiation to circuitry external to the germanium photodetector; receiving electromagnetic radiation by the germanium photodetector; generating electrical signals representative of an intensity of the electromagnetic radiation or representative of data encoded in the electromagnetic radiation; and performing at least one of displaying the electrical signals to a user and recording the electrical signals in a machine-readable memory in non-volatile form.

In one embodiment, the germanium photodetector supports single optical mode operation.

In another embodiment, the electromagnetic radiation is in the wavelength range of substantially 1280-1600 nm in free space.

In still another embodiment, the germanium photodetector supports conduction mode operation.

In yet another embodiment, the germanium photodetector supports operation in avalanche photodiode mode.

In still a further aspect, the invention provides a method of fabricating a germanium photodetector. The method comprises patterning a doped semiconductor wafer having a surface by lithography and etching to create waveguides on the surface; doping the doped semiconductor by implantation and annealing to form a p-type contact and an n-type contact in a layer at the surface of the doped semiconductor wafer; performing germanium epitaxy to provide an intrinsic germanium body having no deliberately added dopant in contact with the n-type contact and the p-type contact, the germanium body having a shape bounded by crystallographic facets oriented at an angle to the surface of the doped semiconductor wafer; and applying metallization to form contact terminals.

In one embodiment, the photodetector is sensitive to electromagnetic radiation is in the wavelength range of substantially 1280-1600 nm in free space.

In another embodiment, the photodetector includes a p-i-n junction.

In a further embodiment, a crystallographic facet is oriented at an angle between substantially 15 degrees and 75 degrees to the surface of the silicon wafer.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 3A is a graph of an optical mode profile of the floating germanium detector of FIG. 2A at −4V reverse bias.

FIG. 3B is a graph of the electrical field of the floating germanium detector of FIG. 2A at −4V reverse bias.

FIG. 5A is a graph of a device IV curve in the dark.

FIG. 5B is a graph of a device IV curve with a laser on.

FIG. 7A through FIG. 7D show cross sections of a wafer as it is being fabricated into a device that embodies aspects of the invention.

DETAILED DESCRIPTION

We describe a novel floating germanium photodetector that significantly simplifies Ge-on-Si detector fabrication process by eliminating the need to dope and contact germanium. The epitaxial Ge is not deliberately doped. It keeps germanium intact from damage and preserves the crystal quality after epitaxy. The device was measured to have responsivity of 1.24 A/W at 1550 nm wavelength, corresponding to 99.2% quantum efficiency. To the best of our knowledge, this is the highest responsivity reported for p-i-n germanium detectors. At −4V reverse bias, dark current is only 40 nA. The measured 3-dB bandwidth is 30 GHz and capacitance is 8 fF. The detector functions for optical radiation with free-space wavelengths from 1280-1600 nm.

The detector geometry allows the optical radiation to be is coupled predominantly into a single mode within the combined Ge/silicon detector geometry, thus maximizing the chance for absorption. It is believed that the optical mode is prevented from leaking into the silicon contacts due to the high index of refraction of Ge.

| Material | Refractive Index |
| --- | --- |
| Si | 3.48 |
| Ge | 4.01 |

The detector geometry is useful to avoid the requirement of contacting metal or a conductive alloy (such as Al or TaN) directly to the Ge, thus simplifying fabrication processes. It is believed that detector performance is improved because metal is not in close proximity with the optical mode.

The detector geometry is useful to avoid the requirement of implanting Ge with dopant species, thus improving optical performance by virtue of reduced absorption by impurities. The elimination of doping of the Ge also simplifies fabrication and reduces cost.

Device Design

Figure 2A:
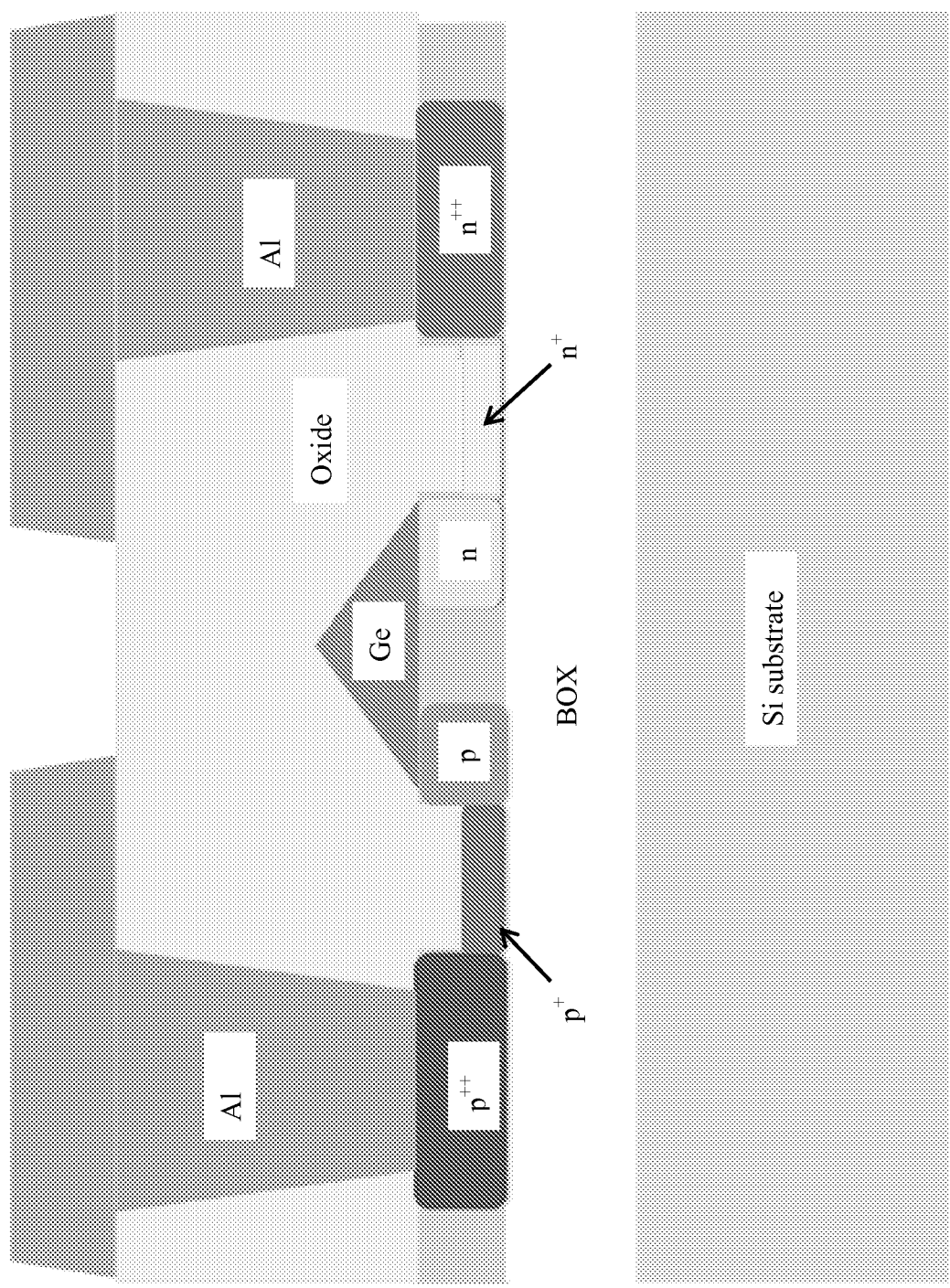
FIG. 2A is a schematic cross-section diagram of an embodiment of a floating germanium detector according to principles of the invention.

A schematic illustration of the floating germanium photodetector is shown in FIG. 2A. As illustrated in FIG. 2A, a silicon wafer, such as a silicon on insulator (SOI) wafer is employed. A buried oxide (BOX) layer is present on the silicon wafer that serves as a handle. The BOX layer insulates the silicon on which the device is fabricated from the silicon handle. In FIG. 2A the intrinsic germanium body is shown as having a triangular cross section. The triangular shape of the germanium in FIG. 2A has been realized in actual device fabrication using chemical vapor deposition (CVD). For fabrication, both plasma enhanced (PE) CVD and ultra-high vacuum (UHV) CVD have been employed. In general, an intrinsic semiconductor, also called an undoped semiconductoror i-type semiconductor, is a pure semiconductor without any significant dopant species present. The number of charge carriers is therefore determined by the properties of the material itself instead of the amount of impurities. In particular, an intrinsic semiconductor, such as intrinsic germanium, is generally understood to have few or no deliberately added dopants, although it is understood that some amount of dopants or impurities may well be present.

The device illustrated in FIG. 2A has silicon n-type and p-type contacts that are in electrical communication with the opposite ends of a germanium triangular body. The silicon n-type and p-type contacts are respectively in electrical communication with metal terminals that serve to provide electrical signals generated in the photodetector to circuitry external to the photodetector.

Figure 1B:
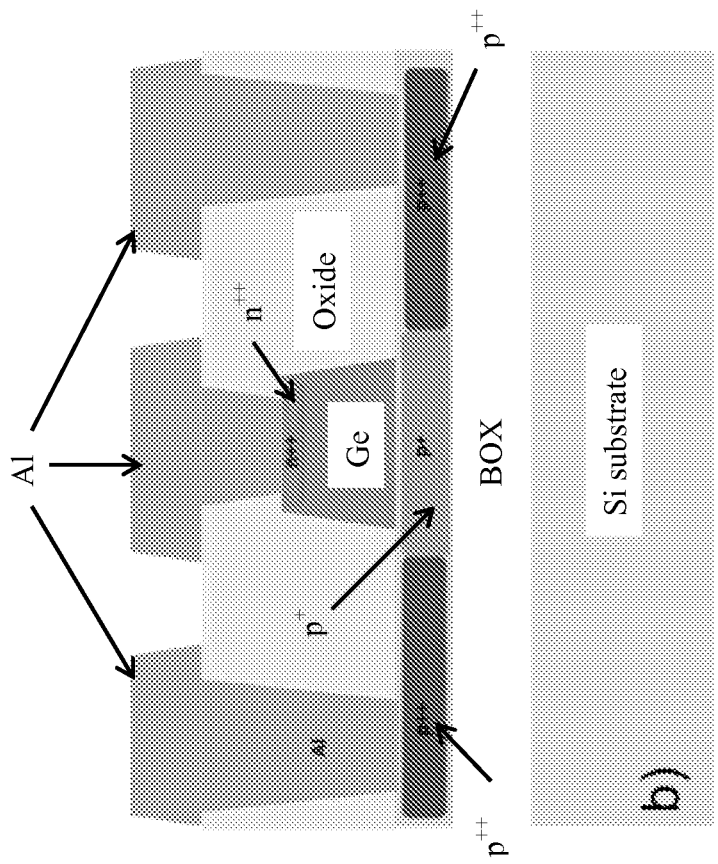
FIG. 1B is a schematic cross-section diagram of a prior art vertical p-i-n Ge-on-Si photodetector.
Figure 2B:
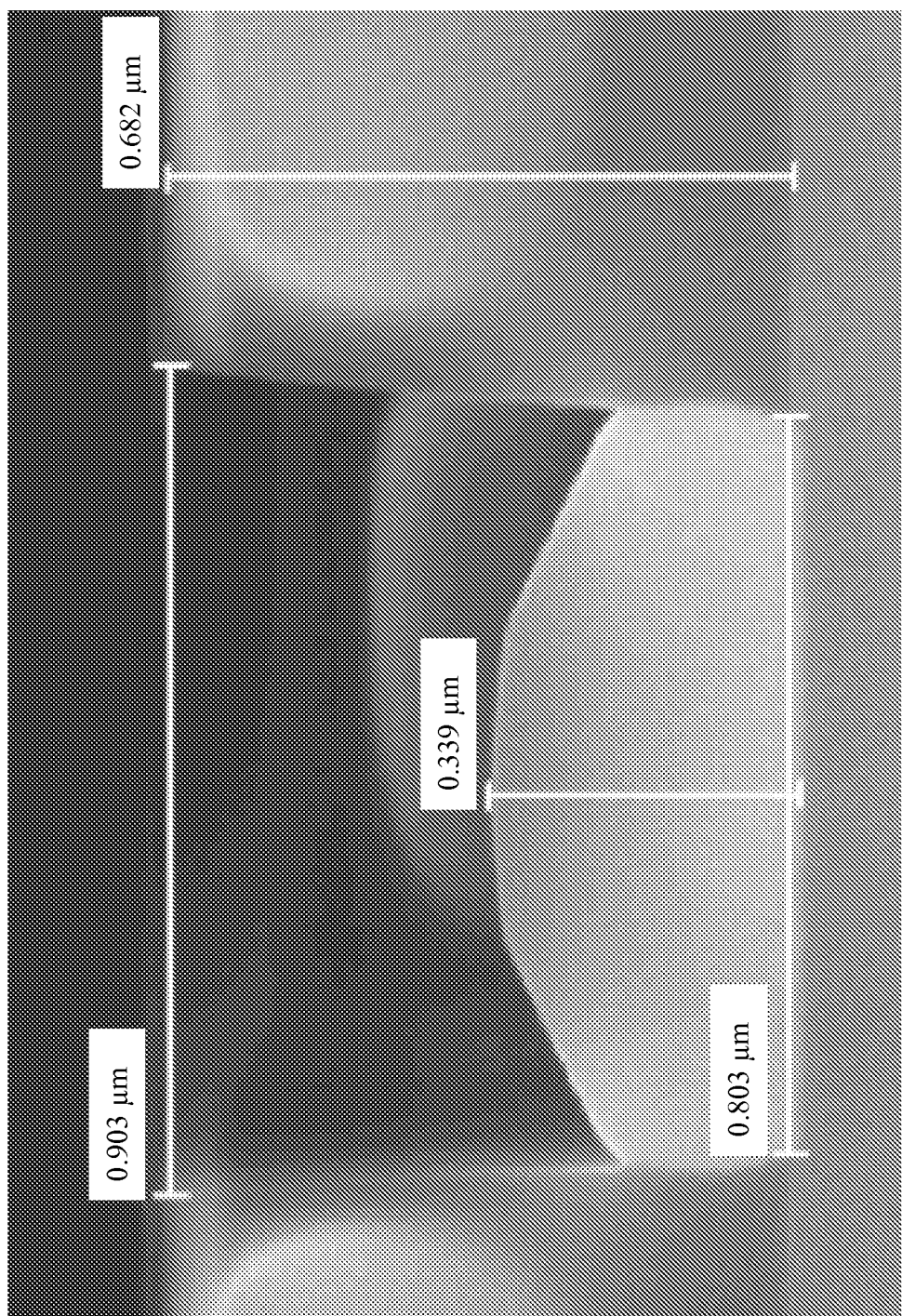
FIG. 2B is a scanning electron micrograph of the intrinsic germanium body and the surrounding structure in another embodiment of a fabricated floating germanium detector.

FIG. 2B is a scanning electron micrograph of the intrinsic germanium body and the surrounding structure in another embodiment of a fabricated floating germanium detector. FIG. 2B shows an alternative shape of the intrinsic germanium body, in which the intrinsic germanium body has a cross section that is defined by a number of facets that together provide a non-planar faceted shape. The shape is not a parallelepiped cross section, nor a triangular cross section, nor a truncated prism cross section as illustrated in FIG. 1B. The shape illustrated in FIG. 2B is fabricated using PECVD or UHVCVD with different deposition conditions from those used to produce the triangular shape illustrated in FIG. 2A.

In some embodiments, the germanium body may be planarized, for example by being subjected to a mechanical or chemical-mechanical polishing (CMP) process. In some embodiments, the planarized germanium body may have a third electrical contact in electrical communication with the planar surface produced in the planarization process.

It is expected that in some embodiments, the germanium photodetector device can be operated as a conduction device, in which the conductive properties of the germanium are changed under illumination.

It is expected that in some embodiments, the germanium photodetector can be operated as an avalanche photodetector (APD). It is expected that photomultiplication can occur either in the germanium or in the silicon.

It is contemplated that in some embodiments, an external heater (such as a resistive heater) can be provided to keep the detector at an elevated temperature for improved performance.

Figure 1A:
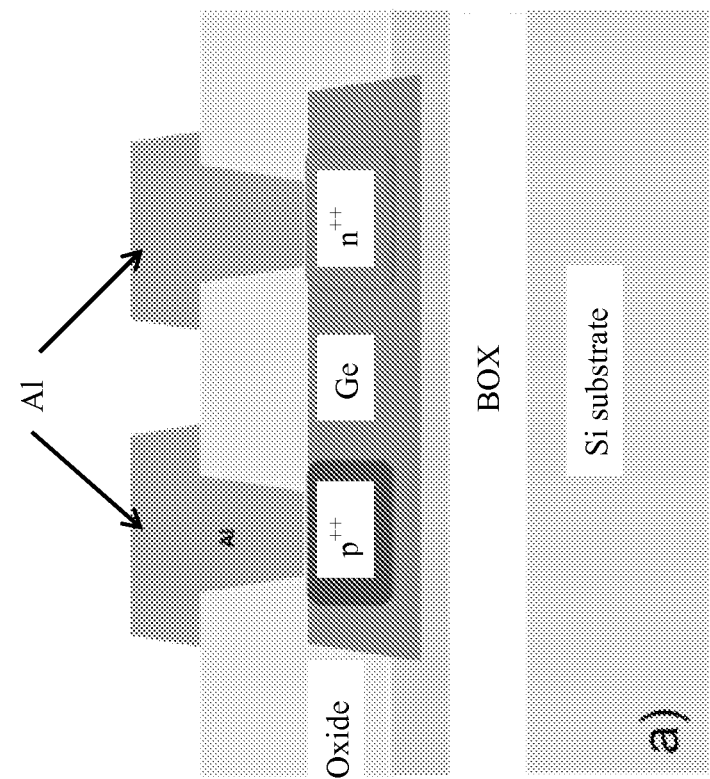
FIG. 1A is a schematic cross-section diagram of a prior art lateral p-i-n Ge-on-Si photodetector.

Compared to conventional detector configuration in FIG. 1A and FIG. 1B, germanium is protected from defects caused by ion implantation damage and metallization. Note that creating metal via plugs is a complicated process that requires contact hole opening, silicide formation, diffusion barrier deposition, and finally metal deposition, patterning and planarization, in addition to the implantation and annealing steps. The process is described in J. D. Plummer, M. Deal, P. D. Griffin, "Silicon VLSI technology: fundamentals, practice, and modeling," (Prentice Hall, 2000). The floating germanium detector configuration significantly simplifies the silicon photonics process flow and reduces cost for building silicon based photonics integrated circuits (PICs). Since it shares exactly the same doping levels and metallization procedures of a silicon modulator, germanium epitaxy is the only extra step to build the device in addition to those present in a process to construct a modulator.

We now discuss the triangular shape of the germanium illustrated in FIG. 2A. The growth rate of crystalline germanium is different in different directions, which is analogous to the anisotropic wet etch of silicon, which naturally stops at the (111) surface due to a much slower etch rate. Germanium geometry also depends on the trench angle of the oxide hard mask, and could be projected by the Wulff construction model. See J. Liu, R. Camacho-Aguilera, J. T. Bessette, X. Sun, X. Wang, Y. Cai, L. C. Kimerling, and J. Michel, "Ge-on-Si optoelectronics," Thin Solid Films 520 (8), 3354-3360 (2012). In one embodiment, the epitaxial germanium was measured to have a 25° sidewall angle versus the silicon surface in the process to build our device. With a germanium base width of 1.5 µm, the triangle height is 0.35 µm.

Despite the simplified fabrication, the floating germanium detector is expected to have higher responsivity than conventional germanium detectors as shown in FIG. 1A and FIG. 1B, because absorption by metal atoms or ions introduced from metal electrodes and free carrier absorption from heavy contact doping are eliminated. Dark current is also expected to be lower because of the preserved crystal quality after epitaxy. To achieve high responsivity, photons should be confined in the intrinsic germanium absorber, and scattering needs to be minimized. The fundamental mode of the germanium silicon hybrid waveguide structure of FIG. 2A is plotted in FIG. 3A. Tight mode confinement in germanium, with confinement factor 88%, ensures efficient absorption and minimizes detector length, and thus capacitance. A 3 µm long germanium taper from 0.22 µm to 1.5 µm in width is used to adiabatically convert light from the input silicon waveguide to the hybrid waveguide.

In absence of the p-i-n junction formed in germanium, the device relies on the fringe field of the silicon junction to sweep out photo-generated carriers. It has been reported that the fringe field and the corresponding capacitance is a non-negligible part of the 220 nm thick siliconpn junction and needs to be accounted for in modulator design. See H. J. Wesley, D. Sacher, and J. K. S. Poon, "Analytical model and fringing-field parasitics of carrier-depletion Silicon-on-Insulator optical modulation diodes," IEEE Photon. J. 5(1), 2200211 (2013). As germanium has a much higher permittivity than typical CMOS dielectrics, such as silicon nitride or silicon dioxide, the portion of fringe field and capacitance will be even higher for the same silicon junction. The junction intrinsic region width in FIG. 3B is selected to match the mode field diameter in FIG. 3A. We numerically solved Poisson's equation and plotted the electrical field distribution in FIG. 3B. The electric field in most parts of the germanium is greater than $10^4$ V/cm, which is high enough for the carriers to drift at saturation velocity. See C. Jacoboni, F. Nava, C. Canali, and G. Ottaviani, "Electron drift velocity and diffusivity in germanium," Phys. Rev. B 24(2), 1014-1026 (1981).

Device Fabrication

We produced a prototype of the device. The floating germanium detector was fabricated using the standard process to create conventional p-i-n detectors with 0.5 µm thick germanium slab, and no additional process split was added thanks to the anisotropic epitaxial growth of germanium. The starting substrate was an 8-inch silicon on insulator (SOI) wafer, with 220 nm, 10 ohm-cm p-type top silicon film, and 2 µm buried oxide on top of a high resistivity silicon handle. Waveguides and grating couplers were patterned using 248 nm UV lithography followed by dry etching. Boron and phosphorus ions were then implanted into silicon, and activated by rapid thermal annealing. Germanium epitaxy followed. Two layers of aluminum metal interconnect completed the fabrication process.

FIG. 7A through FIG. 7D show cross sections of a wafer as it is being fabricated into a device that embodies aspects of the invention. FIG. 7A illustrates the steps of patterning silicon by lithography and etching to create waveguides. FIG. 7B illustrates the steps involved in doping the silicon by implantation and annealing to form a p-type contact and an n-type contact. FIG. 7C illustrates the step of performing germanium epitaxy. FIG. 7D illustrates the steps of applying metallization to provide contact terminals. As needed, vias may be defined in layers of the structure to allow the contact terminals to extend therethrough so as to be accessible at a free surface of the completed structure. Some steps need to be performed in a specific sequence, and some steps might be performed in alternative sequences (or in any order). For example, boron and phosphorus ion implantation can be done in either order.

Device Characterization

Optical Spectrum

Figure 4:
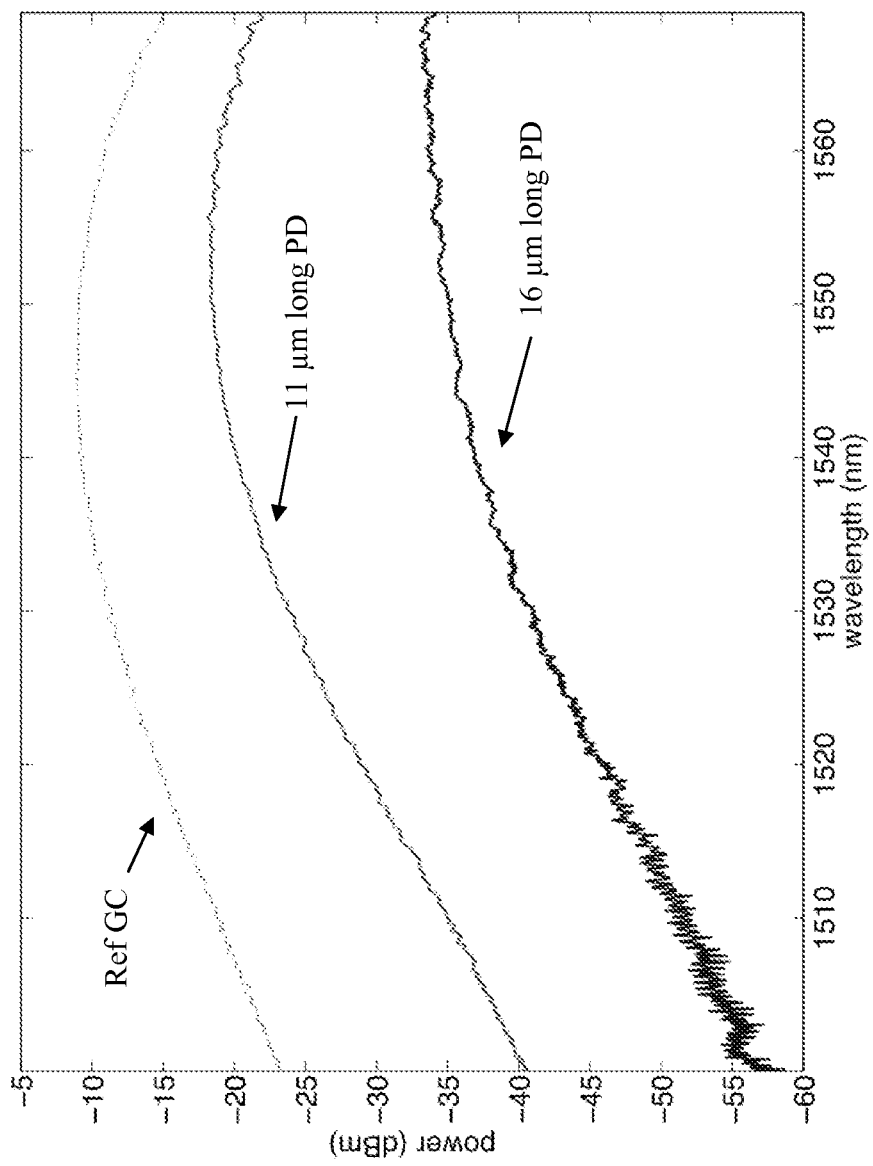
FIG. 4 is a graph showing transmission spectra of floating germanium detectors and a reference grating coupler (GC).

Two sets of characterization structures corresponding to the device cross-section in FIG. 2A were designed. Grating couplers were used as optical I/O to a fiber array in both cases. In Set A, transmitted light after the germanium absorber was guided to another grating coupler, which was used to characterize the germanium efficiency and determine the device length. In Set B, the through port was connected to a y-junction with its two branches tied together, which effectively functioned as a broadband mirror. A fiber array was first aligned to the grating couplers in Set A, and the devices ware measured using a tunable laser (Agilent 81600B). The spectra of two devices with different germanium length, as well as a reference grating coupler, are plotted in FIG. 4. The parabolic line shape was determined by the grating coupler spectral response. A reduction in power level indicates extra loss added by the germanium strip. No interference fringes were observed on the spectrum, confirming that light stayed in its fundamental mode throughout the structure. Single mode operation prevented the loss or waste of photons from scattering or divergence, and also improved absorption per unit length since light was tightly confined in the germanium absorber. The capability to couple light upward into germanium and back down into silicon is useful for constructing germanium absorption modulators as well. The lengths of the two detectors measured as shown in FIG. 4 were 11 μm and 16 μm respectively, including 6 μm for tapers. Stronger absorption towards shorter wavelength is clearly illustrated, because shorter wavelength is further from the band edge of germanium. At 1550 nm, the 16 μm long germanium caused 26 dB attenuation. With the y-junction loop mirror to reflect the transmitted photons back for reabsorption, the 16 μm long detector in device Set B will be able to achieve almost 100% quantum efficiency, if all photo-generated carriers are effectively collected by the electrodes.

IV Sweeps

In addition to the optical properties, device performance also depends on the p-i-n junction shown in FIG. 3B. We probed the device and characterized the IV curve using a semiconductor device analyzer (Agilent B1500A), both in the dark and with a laser on, as shown in FIG. 5A and FIG. 5B. In FIG. 5A, the dark current is only 40 nA at −4V and stays below 90 nA up to reverse bias of −8 V, which is an order of magnitude smaller than the dark current of conventional vertical p-i-n detectors fabricated in the same process. We attribute this improvement to the smaller junction area and preserved germanium crystal quality after epitaxy. When the laser was turned on and set to 1550 nm, light impinged on the detector input port was 0.48 mW after normalizing out the grating coupler insertion loss. The photocurrent increases as the reverse bias voltage and saturates at about −2 V. Below −2 V, the fringe field is not strong enough to sweep out photo-generated carriers before they recombine. Above −2 V, all photo-generated carriers are swept out within their lifetime and are collected by the electrodes. Hence the photocurrent saturates and stays relatively flat until beyond −6 V, where it slightly tails up due to the onset of avalanche gain.

Figure 5C:
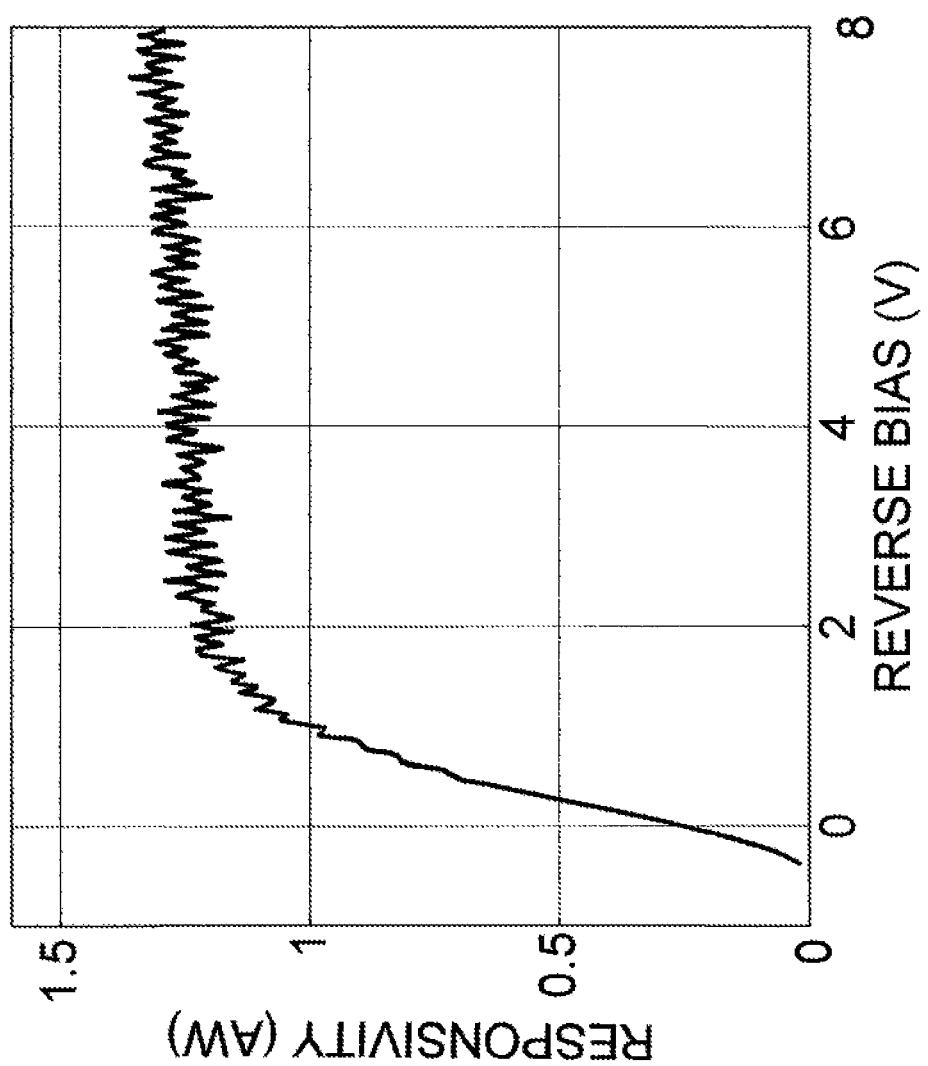
FIG. 5C is a graph of a device responsivity as a function of reverse bias voltage.

Responsivity as a function of bias voltage, extracted from the IV curve under illumination, is plotted as FIG. 5C. The responsivity is 1.24 A/W at −4 V, corresponding to 99.2% quantum efficiency, which is a significant improvement compared to 0.75 A/W achieved in conventional detectors fabricated in the same process. At 1550 nm wavelength, the theoretical maximum responsivity a detector could provide is given by $$R = \frac{I_{ph}}{P_{inc}} = \frac{e}{h\nu} = 1.25 \text{ A/W}$$

where e is the electron charge, h is Planck's constant and ν is the optical frequency. To the best of our knowledge, this is the highest responsivity or quantum efficiency reported for Ge-on-Si p-i-n photodetectors, without photoconductive or avalanche gain. High responsivity or quantum efficiency of this device is attributed to a combination of multiple factors, including the preserved crystal quality, elimination of metal and free carrier absorption that do not generate photocurrent, minimization of scattering and divergence by single mode guiding, and effective collection of photo-generated carriers using the junction fringe field.

Bandwidth and Capacitance

Figure 6:
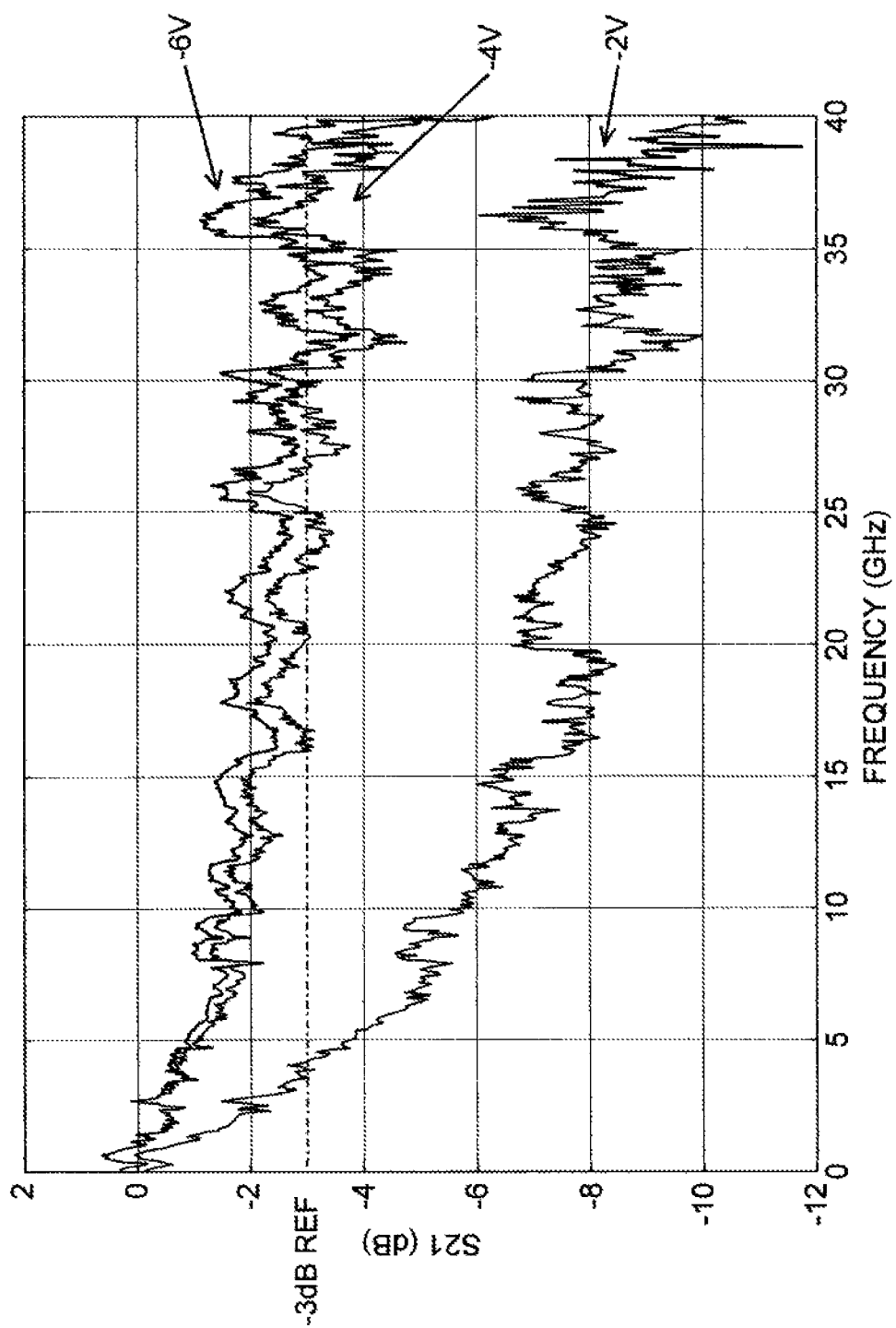
FIG. 6 is a graph of a device S21 at different reverse bias voltages vs frequency.

Excellent performance was achieved at DC. We next discuss the device bandwidth and capacitance. Photocurrent roll off was characterized by measuring the s-parameters using a VNA (Agilent E8361C) and a LiNO$_3$ modulator (Thorlab LN05S). S21 traces at different bias voltages were plotted in FIG. 6. At −2 V the carriers travel at relatively low speed even though the fringe field is strong enough to sweep out the photo-generated carriers, which limits the device bandwidth to only above 5 GHz. As −4 V and −6 V, carriers approach their saturation velocity, and device bandwidth increases to above 30 GHz, which is sufficient to support 40 Gb/s data rates.

Generally photodetector bandwidth is determined either by carrier transit time or device RC time constant. Taking the saturation velocity to be 6.5×10$^6$ cm/s, and the mode field diameter to be 0.85 μm, the transit time is estimated to be $$f_t = \frac{0.44 \, v_{sat}}{L} = 33.6 \text{ GHz}$$

which is close to the measured bandwidth. Transit time limited bandwidth could be improved by using narrower germanium strip, which won't degrade detector efficiency given the strong absorption of germanium, as shown in FIG. 4.

Device capacitance was determined to be 8 fF, calculated from the phase information of the s-parameter, which compares favorably to state-of-the-art. Low capacitance is advantageous for the device to be used in optical interconnects to silicon chips. Assuming 50Ω load impedance, the major contributor of series resistance is the p+ and n+ doped 90 nm silicon slab connecting the silicon underneath germanium and the metal via. The sheet resistance at this intermediate doping level is 3750Ω/□ (Ohms per square) and 1490Ω/□ for p+ and n+ silicon slab respectively. They are 1.5 µm wide and 16 µm long, leading to around 490Ω series resistance. Thus the RC time limited bandwidth is given by $$f_{RC} = \frac{1}{2\pi C_{pd}(R_{pd} + R_L)} = 36.8 \text{ GHz}.$$

Since the light is tightly confined in germanium, it is safe to use higher doping on these connecting slabs without introducing noticeable optical loss from free carrier absorption. The sheet resistance for p++ and n++ dope slab is 137Ω/□ and 60Ω/□, which is an order of magnitude smaller than those of p+ and n+ slab, and will totally remove RC time limit on device operating bandwidth.

Definitions

Unless otherwise explicitly recited herein, any reference to an electronic signal or an electromagnetic signal (or their equivalents) is to be understood as referring to a non-volatile electronic signal or a non-volatile electromagnetic signal.

Unless otherwise explicitly recited herein, any reference to "record" or "recording" is understood to refer to a non-volatile or non-transitory record or a non-volatile or non-transitory recording.

Recording the results from an operation or data acquisition, for example, recording results such as an electrical signal having a particular frequency or wavelength, or recording an image or a portion thereof, is understood to mean and is defined herein as writing output data in a non-volatile or non-transitory manner to a storage element, to a machine-readable storage medium, or to a storage device. Non-volatile or non-transitory machine-readable storage media that can be used in the invention include electronic, magnetic and/or optical storage media, such as magnetic floppy disks and hard disks; a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, Compact Flash cards, PCMCIA cards, or alternatively SD or SDIO memory; and the electronic components (e.g., floppy disk drive, DVD drive, CD/CD-R/CD-RW drive, or Compact Flash/PCMCIA/SD adapter) that accommodate and read from and/or write to the storage media.

THEORETICAL DISCUSSION

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, patent application publication, journal article, book, published paper, or other publicly available material identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A photodetector, comprising:
   a substrate;
   a semiconductor layer on the substrate, including a waveguide extending therein;
   a first n-doped semiconductor contact in the semiconductor layer adjacent to the waveguide;
   a second p-doped semiconductor contact in the semiconductor layer adjacent to the waveguide;
   a first metal terminal, in electrical communication with said first contact and in electrical communication with external circuitry;
   a second metal terminal, in electrical communication with said second contact and in electrical communication with external circuitry;
   a light absorber, consisting of an intrinsic germanium body, mounted on the semiconductor layer in contact with the first and second contacts and lacking direct mechanical contact with the first and second metal terminals.

2. The photodetector according to claim 1, wherein the first contact comprises a first slab underneath the light absorber, a second slab underneath the first metal terminal, and a connecting slab extending in the silicon layer between the first and second slabs; and
   wherein the second contact comprising a first slab underneath the light absorber, a second slab underneath the second metal terminal, and a connecting slab extending in the silicon layer between the first and second slabs.

3. The photodetector according to claim 2, wherein the connecting slab of the first contact comprises a higher doping level than the first slab.

4. The photodetector according to claim 2, wherein the connecting slab of the first contacts comprises a doping level intermediate the respective first and second slabs.

5. The photodetector according to claim 2, wherein sheet resistance of the second slab of the first contact is an order of magnitude smaller than that of the respective connecting slab.

6. The photodetector according to claim 1, wherein the semiconductor layer comprises silicon; and wherein the first and the second contacts comprise first and second doped silicon contacts, respectively.

7. The photodetector according to claim 6, further comprising a buried oxide layer under the semiconductor layer.

8. The photodetector according to claim 6, wherein the first contact includes boron doping; and wherein said second contact includes phosphorus doping.

9. The photodetector according to claim 1, wherein the germanium body comprises a plurality of facets providing a non-planar faceted shape.

10. The photodetector according to claim 9, wherein the germanium body comprises a triangular cross section.

11. The photodetector according to claim 9, wherein one of the facets is oriented at an angle between 15° and 75° to an upper surface of the substrate.

12. The photodetector according to claim 1, wherein the germanium body includes a sidewall at a 25° angle to the semiconductor layer.

13. A method of fabricating a photodetector, comprising:
patterning a waveguide and contacts in a semiconductor layer;
etching the semiconductor layer to create a waveguide, and first and second contacts on either side of the waveguide;
doping the first and second contacts;
annealing the first and second contacts;
depositing a light absorber, consisting of an intrinsic germanium body, on the semiconductor layer in contact with the first and second contacts; and
applying metallization to form first and second metal terminals in electrical communication with the first and second contacts, respectively, but lacking direct contact with the light absorber.

14. The method according to claim 13, wherein the first contact comprises a first slab underneath the light absorber, a second slab underneath the first metal terminal, and a connecting slab extending in the silicon layer between the first and second slabs; and
wherein the second contact comprising a first slab underneath the light absorber, a second slab underneath the second metal terminal, and a connecting slab extending in the silicon layer between the first and second slabs.

15. The method according to claim 14, wherein the doping step comprises doping the connecting slab of each of the first and second contacts with a higher doping level than the respective first slab.

16. The method according to claim 14, wherein the doping step comprises doping the connecting slab of each of the first and second contacts to a level intermediate the respective first and second slabs.

17. The method according to claim 13, wherein said deposition step comprises forming a plurality of facets providing a non-planar faceted shape.

18. The method according to claim 17, wherein the deposition step includes mechanically or chemical-mechanical polishing the intrinsic germanium body.

19. The method according to claim 17, wherein the non-planar faceted shape comprises a triangular cross section.

20. The method according to claim 19, wherein said epitaxial deposition step comprises forming one of the facets to be oriented at an angle between 15° and 75° to an upper surface of the substrate.

* * * * *